United States Patent [19]

Suzuki et al.

[11] Patent Number: 5,240,867
[45] Date of Patent: Aug. 31, 1993

[54] SEMICONDUCTOR INTEGRATED CIRCUIT HAVING INTERCONNECTION WITH IMPROVED DESIGN FLEXIBILITY, AND METHOD OF PRODUCTION

[75] Inventors: Kouichi Suzuki, Tokyo; Norihito Miyoshi, Yokohama; Makoto Yoshida, Kawasaki; Masayuki Kokado, Machida, all of Japan

[73] Assignee: Fujitsu Limited, Kawasaki, Japan

[21] Appl. No.: 757,640

[22] Filed: Sep. 11, 1991

Related U.S. Application Data

[62] Division of Ser. No. 477,544, Feb. 9, 1990, Pat. No. 5,065,216.

[30] Foreign Application Priority Data

Feb. 9, 1989 [JP] Japan .................. 1-32160

[51] Int. Cl.[5] ......................................... H01L 21/265
[52] U.S. Cl. ......................................... 437/31; 437/33; 437/34; 437/78
[58] Field of Search ............... 437/31, 33, 34, 78, 437/79, 67

[56] References Cited

U.S. PATENT DOCUMENTS

| | | | |
|---|---|---|---|
| 3,581,165 | 5/1971 | Seelbach et al. | 317/235 |
| 4,228,448 | 10/1980 | Lalumia et al. | 357/48 |
| 4,631,570 | 12/1986 | Birrittella et al. | 357/48 |
| 4,704,368 | 11/1987 | Goth et al. | 437/31 |
| 4,806,499 | 2/1989 | Shinohara | 437/31 |
| 4,808,548 | 2/1989 | Thomas et al. | 437/67 |
| 4,819,052 | 4/1989 | Hutter | 357/48 |
| 4,857,475 | 8/1989 | Niwano et al. | 437/31 |
| 4,871,685 | 10/1989 | Taka et al. | 437/33 |
| 4,929,993 | 5/1990 | Popovic | 357/48 |
| 4,937,647 | 6/1990 | Sutton | 347/48 |
| 4,960,726 | 10/1990 | Lechaton et al. | 437/31 |
| 5,008,208 | 4/1991 | Liu et al. | 437/31 |

FOREIGN PATENT DOCUMENTS

| | | |
|---|---|---|
| 272453 | 6/1988 | European Pat. Off. . |
| 52-65666 | 5/1977 | Japan . |
| 55-99740 | 7/1980 | Japan . |
| 60-22365 | 2/1985 | Japan . |
| 60-149147 | 8/1985 | Japan . |

OTHER PUBLICATIONS

International Publication No. Wo86/00755, filed Jan. 30, 1986 (International Application No. PCT/US85/00941), "Integrated Circuit Having Buried Oxide Isolation and Low Resistivity Substrate for Power Supply Interconnection", Birrittella et al. (Motorola, Inc.).

IEEE International Solid State Circuits Conference, vol. 32, Feb. 1989, New York, "A 50k-Gate ECl Array with Substrate Power Supply", Norihito Miyoshi et al., pp. 182-183.

Primary Examiner—Brian E. Hearn
Assistant Examiner—Kevin M. Picardat
Attorney, Agent, or Firm—Staas & Halsey

[57] ABSTRACT

A semiconductor integrated circuit comprises a substrate of a first semiconductor type doped by a first impurity element with a first impurity density, the first semiconductor type being one of p-type and n-type semiconductors, a conductive layer formed on a back surface of the substrate, a first layer of a second semiconductor type doped by a second impurity element different from the first impurity element and formed on a front surface of the substrate, the second semiconductor type being the other of the p-type and n-type semiconductors and the first layer having a second impurity density lower than the first impurity density, a second layer of the first semiconductor type formed on the first layer for forming circuit elements therein, a first region of the second semiconductor type extending from a top surface of the first layer and reaching a top surface of the second layer, and a second region of the first semiconductor type extending from a top surface of the substrate and reaching the top surface of said second layer, the first layer and the second region forming a conductive path for supplying a power source voltage to the circuit elements in the second layer from the back surface of the substrate.

4 Claims, 9 Drawing Sheets $V_{IN} > V_{EE}$ when substrate 51 is n $V_{IN} < V_{EE}$ when substrate 51 is p

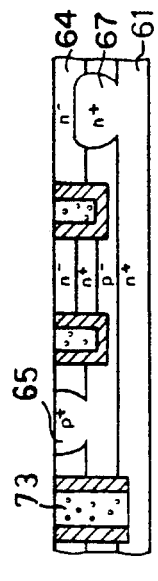
FIG.9H
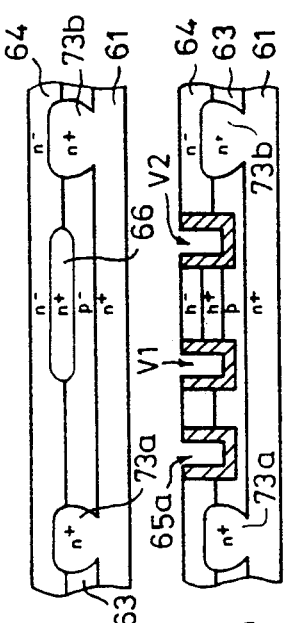
FIG.11A
FIG.11B
FIG.11C
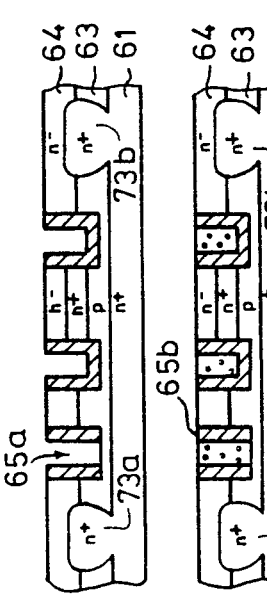
FIG.11D
FIG.11E
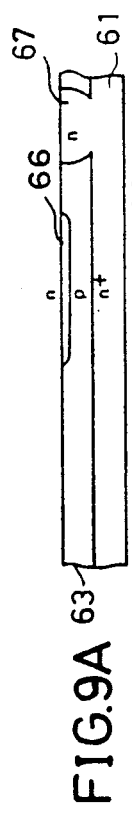
FIG.9A
FIG.9B
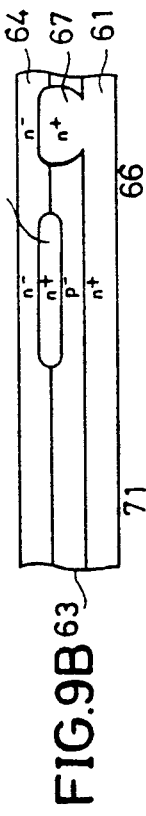
FIG.9C
FIG.9D
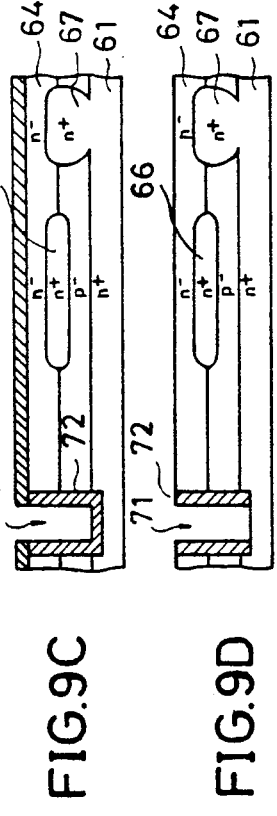
FIG.9E
FIG.9F
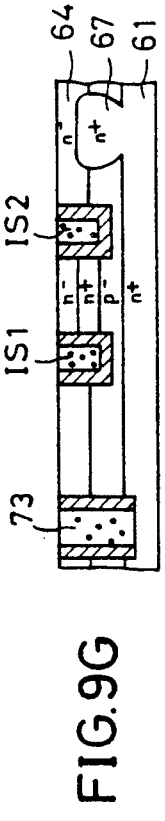
FIG.9G

SEMICONDUCTOR INTEGRATED CIRCUIT HAVING INTERCONNECTION WITH IMPROVED DESIGN FLEXIBILITY, AND METHOD OF PRODUCTION

This application is a division of application Ser. No. 07/477,544, filed Feb. 2, 1990, now U.S. Pat. No. 5,065,216.

BACKGROUND OF THE INVENTION

The present invention generally relates to semiconductor integrated circuits, and more particularly to a bipolar semiconductor integrated circuit having an interconnection with improved design flexibility and to a method of production of same.

The integration density of semiconductor integrated circuits is rapidly increasing due to the progress of various lithography and related techniques. Hence, the number of signal interconnections within the integrated circuit is increasing, and the size of a region for providing power source interconnections for supplying power source voltages also is increasing because of the increase in the power consumption of the integrated circuit. Especially in the case of a bipolar integrated circuit, it is impossible to reduce the current consumption of each circuit below a predetermined value which is required to maintain the high-speed operation of each of the circuits.

In addition, the number of multi-level interconnections is limited to approximately three because problems, such as disconnection or inconsistent thickness of the interconnection, are easily caused when four or more levels of interconnections are stacked. Consequently, the chip size becomes large because of the need to increase the number of signal interconnections in each level and to widen the power source interconnections. Hence, there is a demand to prevent such an increase of the chip size. On the other hand, when the length of the signal interconnection is long, it is impossible to achieve high-speed circuit operation even when high-speed circuit elements are used.

FIGS. 1A and 1B are a plan view and a cross sectional view, respectively, showing an example of a conventional semiconductor integrated circuit. In FIGS. 1A and 1B, a semiconductor chip 12 is accommodated within a stage 11 of a package 10. Terminals 13 for signal input and output and terminals 14 for supplying power source voltages $V_{CC}$ and $V_{EE}$ are provided on the semiconductor chip 12, and these terminals 13 and 14 are wire-bonded to package leads 15.

A first power source interconnection (not shown) for the power source voltage $V_{CC}$ and a second power source interconnection 16 for the power source voltage $V_{EE}$ are provided on the semiconductor chip 12. The first and second power source interconnections respectively have stripe patterns and are oriented relatively to each other such that the first, if shown in FIG. 1A, would intersect the second in the plan view. In use, and for example, an emitter coupled logic (ECL) circuit may be formed between the first and second power source interconnections.

FIG. 2 is a cross sectional view of the semiconductor chip 12. As shown in FIG. 2, the semiconductor chip 12 has a p⁻-type substrate 21 provided with a metallized layer 20 on a back surface thereof. An n⁺-type buried layer 22 which becomes a collector, an n-type epitaxial layer 23, a p⁺-type isolation layer 24, a p-type diffusion layer 25 which becomes a base, an n⁺-type diffusion layer 26 which becomes an emitter, an n⁺-type diffusion layer 27 which becomes a collector contact, and a p-type diffusion layer 28 which becomes a resistor, are provided on a front surface (i.e., the upper, main surface, as shown in FIG. 2) of the p⁻-type substrate 21. In addition, the semiconductor chip 12 has insulator layers 29 and 30 indicated by cross-hatching, a first interconnection 31, and a second interconnection 32. For example, the second interconnection 32 corresponds to the second power source interconnection 16 for the power source voltage $V_{EE}$ shown in FIGS. 1A and 1B.

When considering an integrated circuit with 1,000 gates where the current consumption is 1 mA per gate, for example, a current of 1A flows in total. When the power source interconnection is an aluminum interconnection having a current density of $2 \times 10^5$ A/cm² and a thickness of 1 micron, the power source interconnection needs a large width of 0.5 mm. In addition, there are problems in that a voltage drop caused by the large current flow is large in the power source interconnection having the stripe pattern and that the noise margin of the circuit is poor.

Because of the need to reduce the capacitance between the collector (region 22) and the substrate 21, that is, mainly the capacitance introduced between the n⁺-type buried layer 22 and the substrate 21, the substrate 21 has a low impurity density with a high resistivity in the range of 5 Ωcm to 30 Ωcm. Normally, the substrate 21 has a thickness of 500 microns, and for this reason, it is impossible to supply the power source voltage from the back surface of the substrate 21 when the voltage drop is taken into account. Thus, the first and second interconnections 31 and 32 are used to supply the power source voltages.

Therefore, the conventional semiconductor integrated circuit suffers problems in that the voltage drop is large due to the long power source interconnections, and the freedom with which the signal interconnections may be designed is limited because the signal interconnections must be positioned so as to avoid the power source interconnections. In other words, the design flexibility of the interconnection is poor in the conventional integrated circuit. Furthermore, there is another problem in that the chip size becomes large because of the need to provide a large number of terminals for the power source voltages on the semiconductor chip.

In order to overcome the problem, a coinventor herein proposed a semiconductor integrated circuit shown in the Japanese Laid-open Patent Application No. 01-73669 published on Mar. 17, 1989 and corresponding to the United States patent application Ser. No. 243,745 filed Sep. 13, 1988, European Patent Application No. 88114886.0 filed Sep. 12, 1988 and Korean Patent Application No. 88-11860 filed Sep. 14, 1988, the construction of which is shown in FIG. 3. The inventor of the aforesaid U.S. and corresponding foreign applications, each thereof assigned to Fujitsu Limited, is Masayuki Kokado, a coinventor of the present application.

Referring to FIG. 3, the proposed device has a p⁺-type substrate 41 having a high impurity density with a resistivity of 0.1 Ωcm or less. A metallized layer (conductive layer) 42 is provided on a back (or lower, main) surface of the p⁺-type substrate 41. A p⁻-type epitaxial layer (first p-type layer) 43 having a high resistivity in the range of 1 Ωcm to 30 Ωcm is formed on a front (or upper, main) surface of the p⁺-type substrate 41. A p+-type layer (second p-type layer) or region 44 having a low resistivity is formed in a selected position within the p−-type epitaxial layer 43.

Similarly as in the case of the conventional semiconductor chip shown in FIG. 2 described before, an n+-type buried layer 22a which becomes a collector, an n-type epitaxial layer 23a, a p+-type isolation layer or region 24a, a p-type diffusion layer 25a which becomes a base, an n+-type diffusion layer 26a which becomes an emitter, an n+-type diffusion layer 27a which becomes a collector contact, and a p-type diffusion layer 28a which becomes a resistor are provided on the front (upper, main) surface of the p+-type substrate 41. In addition, the semiconductor chip has insulator layers 29a and 30a indicated by cross-hatching, a first interconnection 31a, and a second interconnection 32a.

Hence, a conductor path is formed from the metallized layer 42 to the first and second interconnections 31a and 32a through the p+-type substrate 41 having the low resistivity, the p+-type layer 44 and the p+-type isolation layer 24a. The second interconnection 32a is connected to transistors and resistor elements formed on the front substrate (or top) surface of the substrate 41.

According to the semiconductor integrated circuit of this previous proposal, the length of the power source interconnection is shortened and the voltage drop can be decreased compared to the conventional semiconductor integrated circuit. In addition, the noise margin is improved and it is possible to achieve high-speed circuit operation. Moreover, because the conductor path for supplying the power source voltage is arranged vertically on the substrate, the signal interconnections can be designed with a large degree of freedom, thereby making it possible to prevent the chip size from increasing.

In this previous semiconductor integrated circuit, however, there arises a problem in that the voltage which may be applied to the substrate 41 via the metallized layer 42 is limited to a low voltage. Note that there is formed a p-n junction in this structure, as shown by shading in FIG. 3 between the region 24a and the layer 23a, which permits the current to leak into the layer 232 and further to the layer 27a through the p-n junction when the voltage applied to the metallized layer 42 exceeds the threshold voltage of the p-n junction. Such a forward biasing of the p-n junction can occur when the voltage at the epitaxial layer 23a becomes lower than the voltage at the p+-type isolation layer 24a in response, for example, to the collector voltage appearing in the collector contact region 27a. Thus, in order to avoid the undesirable forward biasing of the p-n junction, it is necessary to maintain the voltage at the layer 24a, and hence the voltage applied to the metallized layer 42, as low as possible. As a matter of fact, the voltage which may be applied to the metallized layer 42 is limited to the most negative voltage used in the integrated circuit.

A similar problem occurs also in the case that the conductive type of the semiconductor layers in FIG. 3 is reversed. In this case, the voltage which may be applied to the metallized layer 42 is limited to the most positive voltage used in the integrated circuit. Hence, the integrated circuit of FIG. 3 has a problem in that the degree of freedom of circuit design is substantially limited.

SUMMARY OF THE INVENTION

Accordingly, it is a general object of the present invention to provide a novel and useful semiconductor integrated circuit in which the foregoing problems are eliminated, and to a method of producing same.

Another and more specific object of the present invention is to provide a semiconductor integrated circuit comprising a substrate of a first conductivity type, a first semiconductor layer of a second conductivity type provided on the substrate, and a second semiconductor layer of the first conductivity type provided on the first semiconductor layer and on which active device or devices are provided, wherein there is provided an isolation region having the second conductivity type in the second semiconductor layer and wherein a conductive region of the first conductivity type is provided such that the conductive region extends from the substrate and through the second and first semiconductor layers to the top surface of the second semiconductor layer. The isolation region has applied thereto either the highest positive voltage or lowest negative voltage such that the p-n junction formed between the isolation region and the second semiconductor layer surrounding the isolation region is maintained in the reversely biased state while the conductive region is used for supplying the electric current to the active device or devices at the surface of the second semiconductor layer. According to the semiconductor integrated circuit of the present invention, it is possible to apply various voltages to the active device or devices on the second semiconductor layer in contrast to the prior art device. Further, the length of the power source interconnection is reduced and the voltage drop therethrough is effectively reduced thereby. In addition, it is possible to reduce the member of power source interconnections on the surface of the semiconductor chip. As a result, signal interconnections may be designed with a large degree of freedom and it is possible to prevent the chip size from increasing. The biasing of the isolation region does not complicate the construction of the device since such biasing does not require substantial current and the connection to the isolation region can be made by a thin conductor stripe.

Other objects and further features of the present invention will be apparent from the following detailed description when read in conjunction with the accompanying drawings.

BRIEF DESCRIPTION OF THE DRAWINGS

FIGS. 9A-9H are cross-sectional views showing successive steps in the fabrication process of the integrated circuit of FIG. 5;

FIGS. 11A-11E are cross-sectional views showing successive steps in the fabrication process of the integrated circuit of FIG. 10.

DETAILED DESCRIPTION

First, the principle of the present invention will be described with reference to FIG. 4 which illustrates schematically the essential part of the integrated circuit of the present invention. For the sake of clarity of the explanation and drawing, only the essential part is illustrated.

Figure 4:
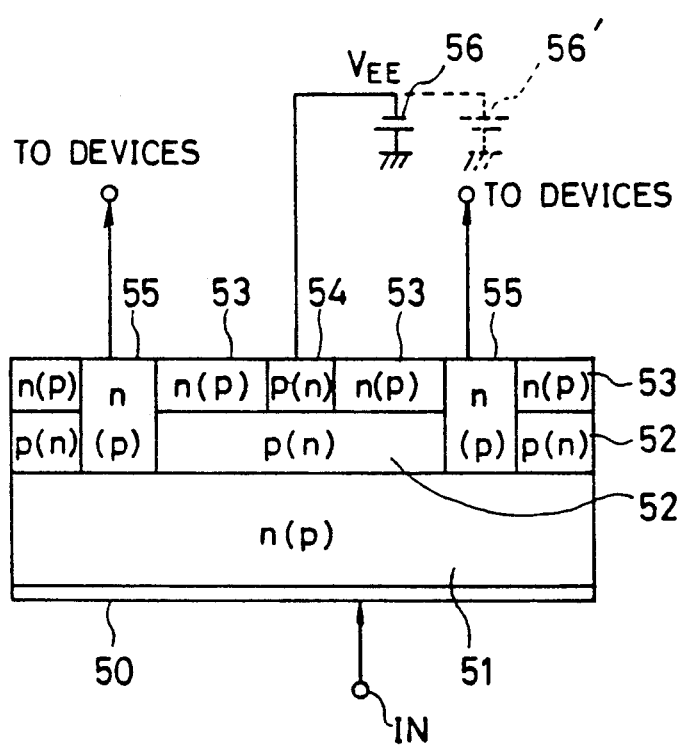
FIG. 4 is a schematic view showing the fundamental structure of the integrated circuit of the present invention.

Referring to FIG. 4, the integrated circuit of the present invention comprises a substrate 51 of the n-type or the p-type, and the bottom (or rear) surface of which a metallization layer 50 is provided. In the following description, it is assumed that the substrate 51 is doped to the n-type. In the alternative case that the substrate 51 is doped to the p-type (as shown by "(p)"), the conductive type of the semiconductor layers appearing in the drawing would be reversed (as shown likewise in parenthesis in FIG. 4).

On the bottom or rear surface of the substrate 51, a first semiconductor layer 52, of the p-type and having a high resistivity, is provided and on the first semiconductor layer 52, a second semiconductor layer 53, of the n-type, is provided. Further, an isolation region 54 of the p-type is formed at a selected position in the second semiconductor layer 53 so as to be surrounded by the n-type semiconductor material of the second semiconductor layer 53. Further, conductive regions 55 of the n-type are formed so as to extend through the first and second semiconductor layers 52 and 53 and thus from the upper (or front) surface of the substrate 51 to the upper surface of the second semiconductor layer 53 corresponding as well to the upper, or front, surface of the multilayered structure.

In operation, the metallized layer 50 is connected to an input terminal IN to which a suitable voltage is applied, while the isolation region 54 is connected to a bias voltage source 56 which applies the most negative voltage, e.g., the source voltage $V_{EE}$, used in the integrated circuit to the isolation region 54. In response thereto, the p-n junction formed between the isolation region 54 and the rest of the second semiconductor layer 53 is biased strongly in the reverse direction and this reversely biased state is maintained during the operation of the integrated circuit. Even when the voltage applied to the input terminal IN is greater than $V_{EE}$, the reversely biased state is maintained or even enhanced. Thus, a desired source voltage applied to the input terminal IN is supplied to the desired device or devices via a path passing through the conductive region 55 without leaking to other region in the second semiconductor layer 53. Further, because of existence of capacitance along the boundary between the substrate 51 and the first semiconductor layer 52, any fluctuation of the source voltage is compensated and the operation of the devices in the integrated circuit is stabilized.

In the alternative case that the substrate 51 is doped to the p-type, the isolation region 54 has applied thereto the highest voltage used in the integrated circuit by the corresponding, alternative bias voltage source 56' providing the bias voltage of opposite polarity and the reverse biasing of the p-n junction is maintained.

Next, a first embodiment of the semiconductor integrated circuit of the present invention will be described with reference to FIG. 5.

Figure 5:
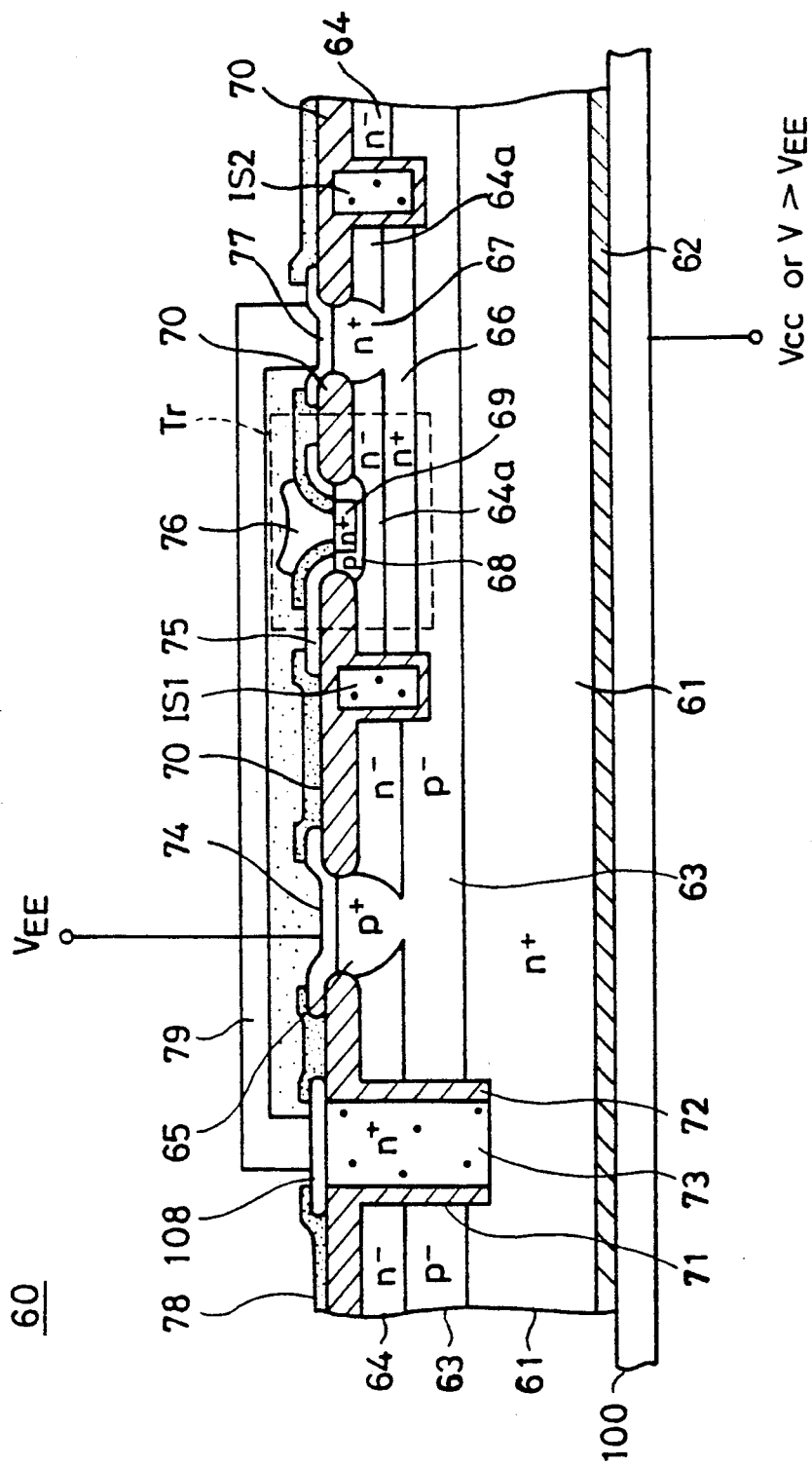
FIG. 5 is a cross-sectional view showing the structure of a semiconductor integrated circuit according to a first embodiment of the present invention.

Referring to FIG. 5, the device has an n+-type substrate 61 of a semiconductor chip 60 having a high impurity density with a resistivity of 0.1 Ωcm or less. A metallized layer (conductive layer) 62 is provided on the back (or lower) surface of the n+-type substrate 61. A p−-type epitaxial layer (first p-type layer) 63 having a high resistivity in the range of 1 Ωcm to 30 Ωcm is formed on the front (or upper) surface of the n+-type substrate 61. An n−-type epitaxial layer (second n-type layer) 64 having a high resistivity is provided on the first p-type layer 63, and a p+-type conductive region 65 is formed at a selected position within the n−-type epitaxial layer 64 as a continuation of the first p-type layer 63. As an example, the layer 65 may be formed by ion implantation.

Figure 1A:
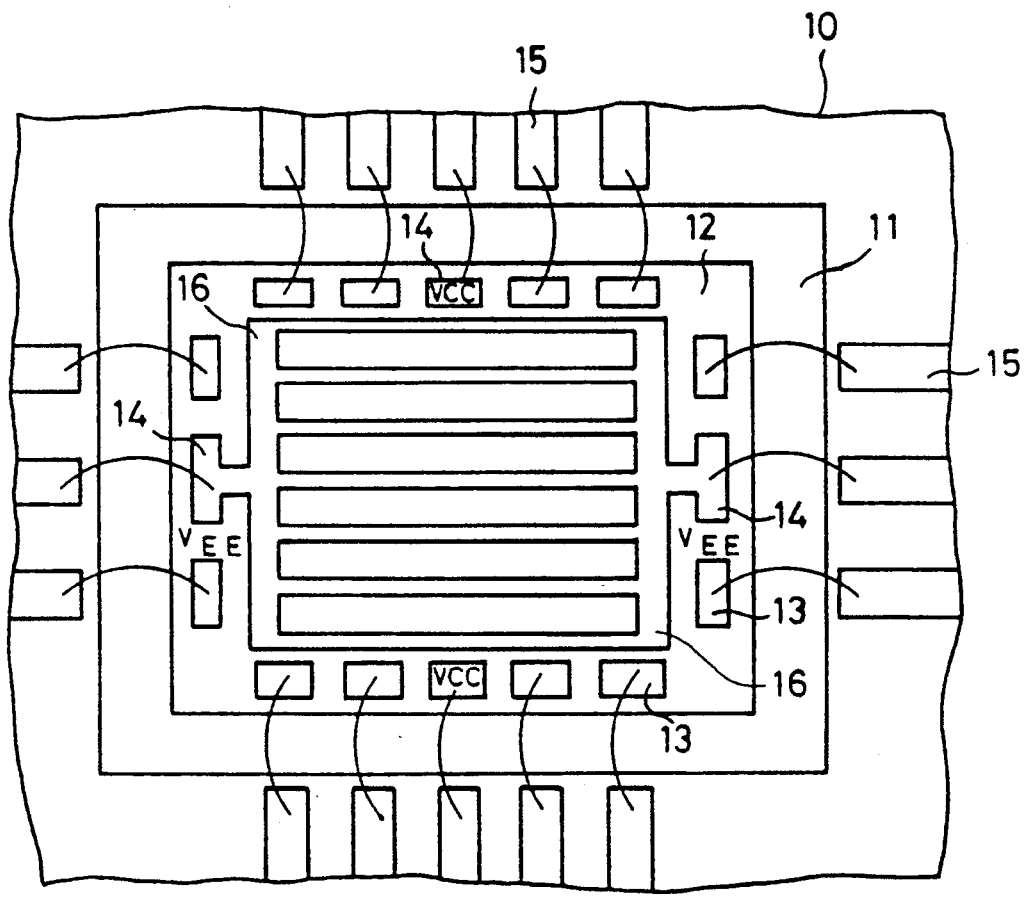
FIGS. 1A and 1B are a plan view and a cross-sectional view, respectively, showing an example of a conventional semiconductor integrated circuit.
Figure 1B:
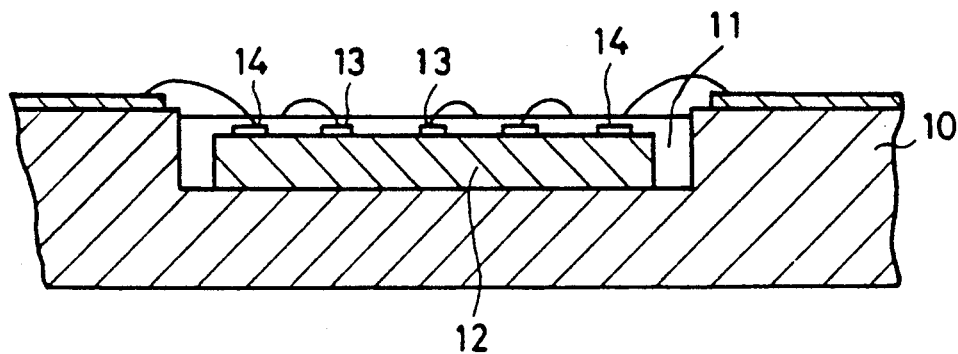
Figure 2:
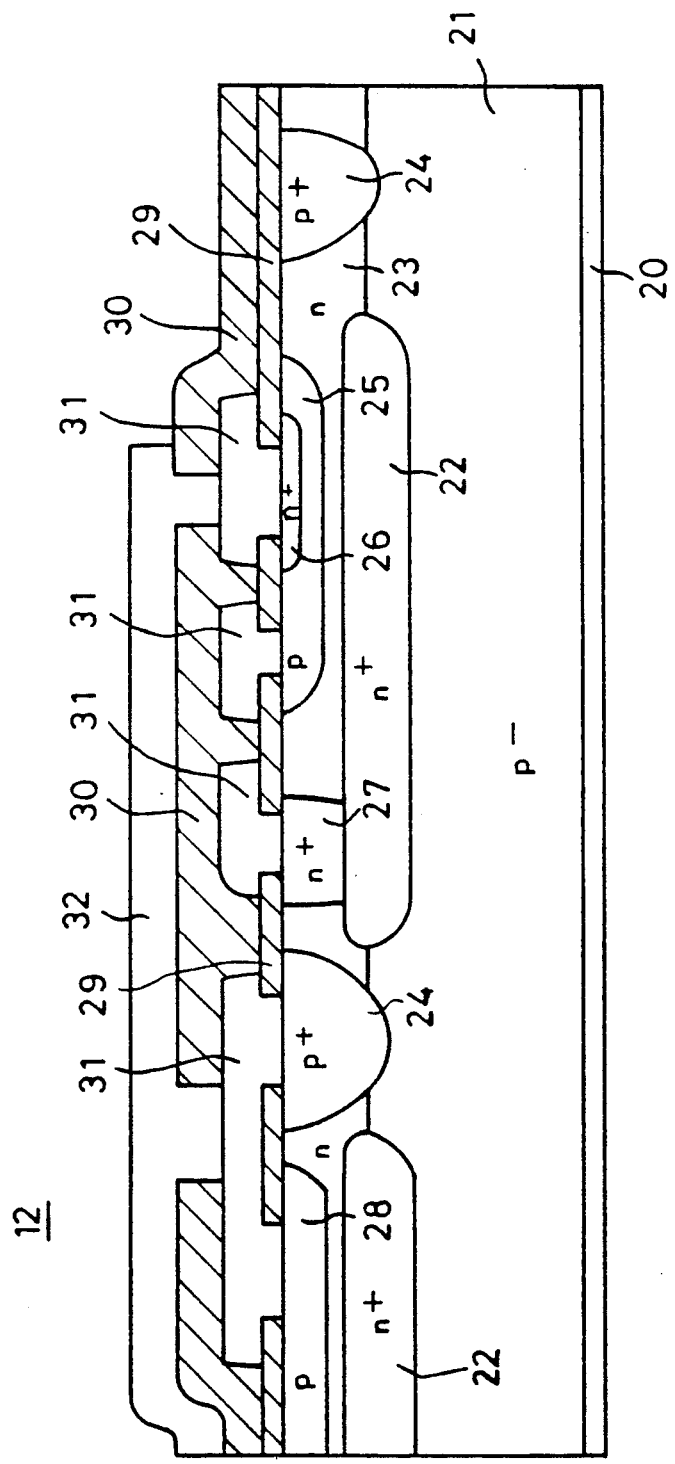
FIG. 2 is a cross sectional view of the semiconductor chip shown in FIGS. 1A and 1B.
Figure 3:
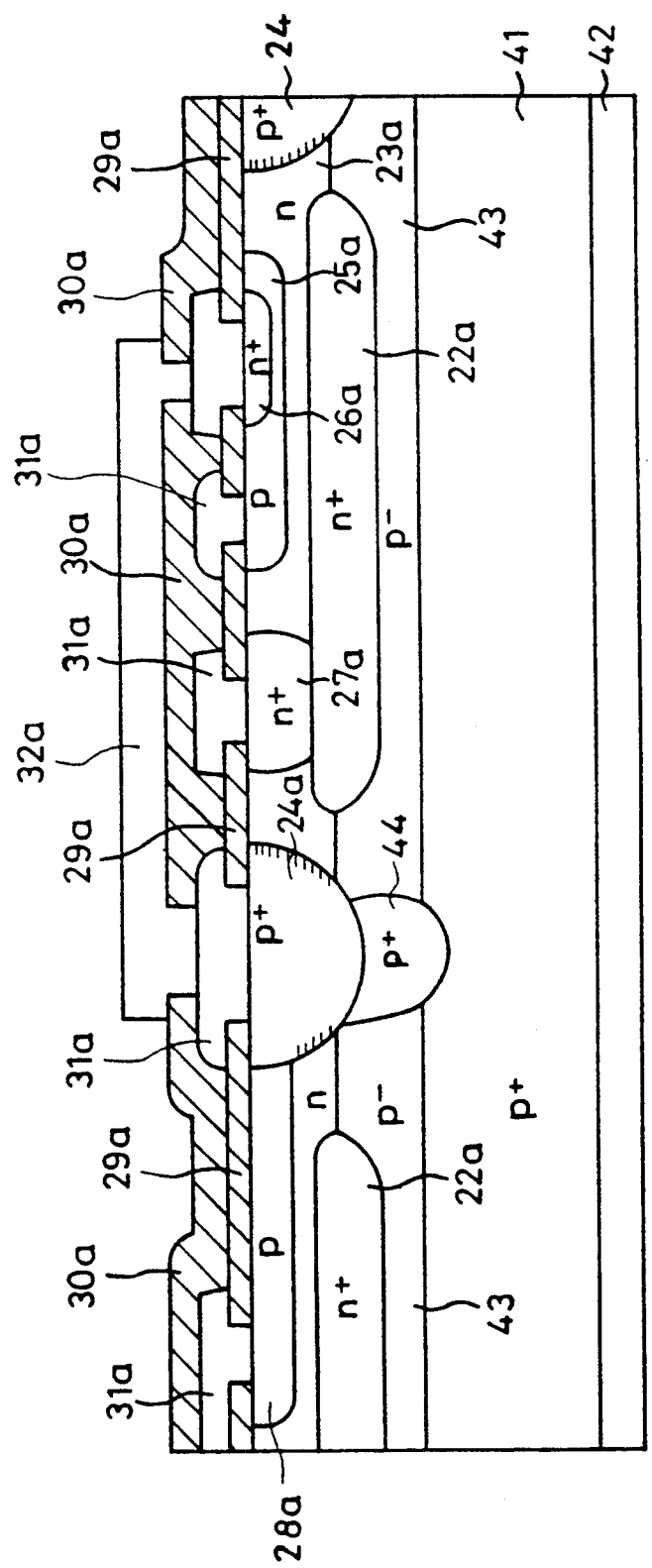
FIG. 3 is a cross sectional view showing another prior art semiconductor chip proposed previously by the above-noted coinventor herein.

Similarly to the case the conventional semiconductor chip shown in FIG. 3 described before, an n+-type buried layer 66 is formed under the n−-type epitaxial layer 64 including a part of the layer 64, an n+-type conductive layer or region 67 is formed in a selected part of the remaining portion 64a of the n−-type epitaxial layer 64 in correspondence to a location above the buried layer 66 so as to be a continuation of the buried layer 66; the remaining portion 64a of the n−-type epitaxial layer 64 acts as the collector of a pnp-transistor Tr formed on the chip 60, a p-type diffusion layer 68 formed in the surface part of the n−-type epitaxial layer 64 as the base, and an n+-type diffusion layer 69 further defined in the p-type diffusion layer 68 as the emitter.

The surface of the chip 60 is provided with a field oxide layer 70 for device isolation except for the area of the chip on which the npn-transistor Tr is formed or the area where the p+-type isolation region 65 and the n+-type conductive region 67 are exposed. In the illustrated example, the transistor Tr is isolated by isolation trench structures IS1 and IS2 which are of an ordinary structure and thus include an insulation layer on the trench sidewalls and a polysilicon region within the trench, surrounded by the insulation. A detailed description of the structures IS1 and IS2 will be omitted. Further, there is provided a U-groove 71 extending from the upper surface of the chip 60 to the substrate 61 and thus through the layers 64 and 65. The side wall of the U-groove 71 is covered by an oxide layer which extends as a continuation of the field oxide layer 70, and the groove 71 is filled with an n+-type polysilicon to form a conductive region 73 which extends from the substrate 61 to the surface of the chip 60.

On the surface of the chip 60, there are provided electrodes 108, 74, 75, 76 and 77 respectively in correspondence to the conductive region 73, p+-isolation region 65, p-type diffusion layer 68 corresponding to the base, n+-type diffusion layer 69 corresponding to the emitter, and the collector contact 67 connected to the collector buried layer 66 of the transistor Tr. These electrodes are separated from each other by an insulator film 78 deposited on the surface of the chip 60.

Hence, a conductor path is formed from the metallized layer 62 to the surface of the chip through the n+-type substrate 61 having the low resistivity and the n+-type conductive region 73 and when a source voltage is supplied to the matallized layer 62, this source voltage is passed to the surface of the chip 60 via the conductive region 73. On the surface of the chip 60, various interconnection patterns 79 are provided to distribute the source voltage to the desired terminal of the device as will be described later.

When using the device 60 of FIG. 5, the device 60 is placed on a stage 100 to which a source voltage and the like is applied and the electrode 74 covering the exposed surface of the p+-type conductive region 65 is supplied with the most negative voltage $V_{EE}$ used in the device. As a result, the p-n junction formed between the region 65 and the n−-type layer 64 surrounding the region 65, and the p-n junction formed between the p−-type layer 63 to which the region 65 is connected and the n+-type substrate 61, are always biased reversely and prohibits the current supplied to the metallized layer 62 from the external voltage source from entering into the region of layer 64 above the p−-type layer 63. The p-n junction aforementioned is maintained in the reversely biased state as long as the voltage to the metallized layer 62 is greater than the voltage $V_{EE}$ applied to the p+-type conductive region 65 and thus, any desired voltage satisfying this condition such as the source voltage $V_{CC}$, which may be the ground level voltage, can be supplied to the interconnection patterns 79 at the surface of the chip 60 via the stage 100, metallized layer 62, and the conductive region 73 without the problem of the current leaking into the layer 63 and hence to various parts (e.g., the transistor Tr) of the integrated circuit 60.

Associated with the structure of FIG. 5, there is another advantage in that a capacitance is formed along the p-n junction between the layer 63 and the substrate 61 and this capacitance acts as a shunt capacitance. Thereby, the capacitance absorbs any fluctuation of the source voltage $V_{CC}$ or $V_{EE}$. Thus, the operation of the device constructed on the power supply structure of FIG. 5 is immune to the fluctuation of the source voltage and operates with improved stability.

The oxide layer at the side wall of the U-groove 71 is provided for increased insulation between the region 73 and the surrounding region and may be omitted.

Figure 6A:
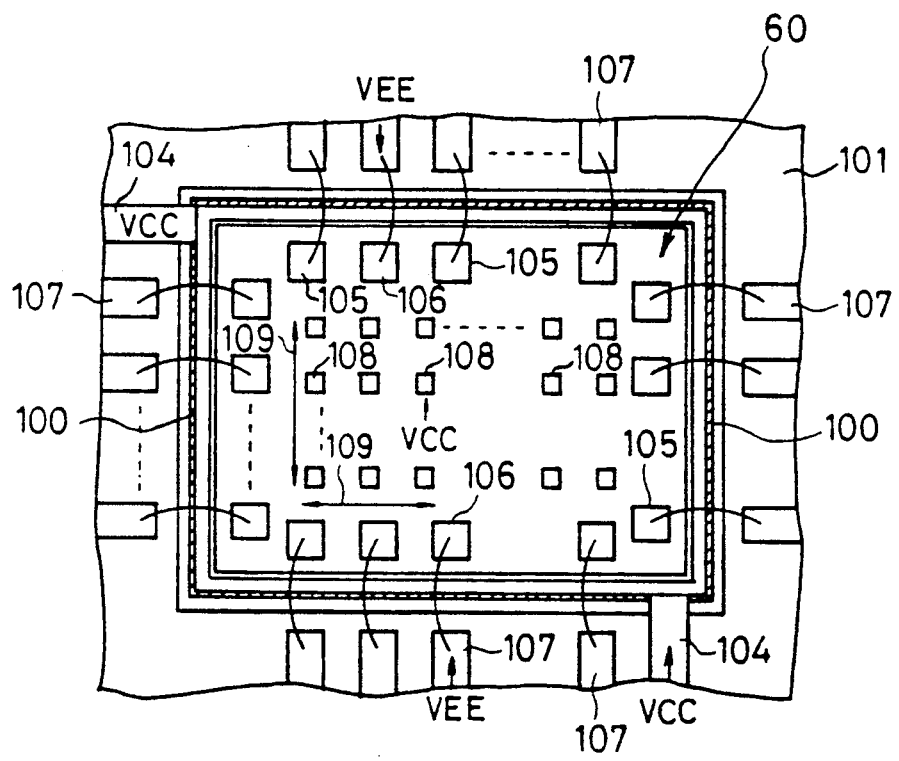
FIGS. 6A and 6B are a plan view and a cross-sectional view, respectively, showing the first embodiment of the semiconductor integrated circuit according to the present invention.
Figure 6B:
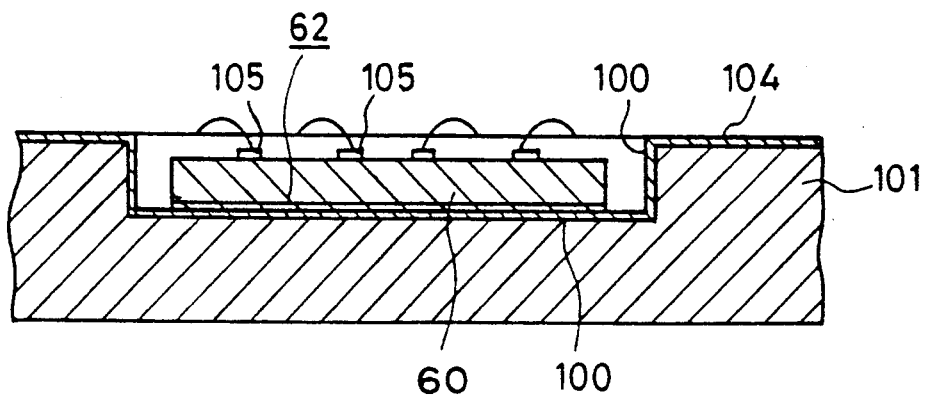

The semiconductor chip 60 having the structure shown in FIG. 5 is mounted on the stage 100 of a package 101 as shown in FIGS. 6A and 6B. FIGS. 6A and 6B are plan and cross-sectional views, respectively, showing the first embodiment of the semiconductor integrated circuit according to the present invention in a state that the integrated circuit is mounted on the package 101.

In FIGS. 6A and 6B, the semiconductor chip 60 is placed on the stage 100 provided in the package 101. The stage 100 may be a metallization layer provided on the package 101 and is connected to package leads 104 for the power source voltage $V_{CC}$. The semiconductor chip 60 is connected electrically to the package 101 via the metallized layer 62 in contact with the metallized layer stage 100 of the package 101. Further, terminals 105 for signal input and output and terminals 106 for supplying the power source voltage $V_{EE}$ are provided on the semiconductor chip 60, and these terminals 105 and 106 are connected to package leads 107 by wirebonding or the like. Note that the terminal 106 is connected to the electrode 65 covering the p+-type region 74 by conductor patterns (not shown) on the surface of the chip 60.

One advantage of the present construction is that the distribution of the source voltage $V_{CC}$ to various electrodes 77 on the chip does not require passage of the substantial current. Thus, such wiring as afforded by, change the electrode 77 can be achieved by a thin conductor stripe and thus without causing complexity in wiring of the chip.

Accordingly, the power source voltage $V_{CC}$ is supplied to the semiconductor chip 60 through the package lead 104, the metallized layer 100 and the metallized layer 62 while maintaining the reverse bias of the p-n junction between the n+-type substrate 61 and the p−-type layer 63 due to the power source voltage $V_{EE}$ being applied to the terminal 106 and hence to the electrode 65 covering the p+-type region 74, and thereby the power source voltage $V_{CC}$ is passed through the n+-type substrate 61, the n+-type region 73 and electrode 108 to the interconnection conductor 79. Finally, the power source voltage $V_{CC}$ thus directed to the surface of the chip 60 is distributed to the active devices thereof, such as an ECL circuit or the like within the semiconductor chip 60, through the interconnection conductor 79. In FIGS. 5 and 6A, interconnection electrodes for supplying the power source voltage $V_{CC}$ to the interconnection conductor 79 at the semiconductor chip 60 are shown by a numeral 108. This interconnection electrode 108 corresponds to the electrode covering the exposed surface of the conductive region 73 of FIG. 5 to which the interconnection conductor 79 is connected.

The interconnection electrode 108 each occupy a small area and are scattered in the plan view in FIG. 6A in a row and column formation in correspondence to the active devices formed on the substrate 61 of the chip. Hence, the signal interconnections may be provided between the interconnection electrodes 108 as indicated by arrows 109, and the signal interconnections may be designed with a large degree of freedom. The power source voltage $V_{CC}$ is supplied from the back surface of the semiconductor chip 60 in correspondence to the position of the circuit which requires the power source voltage $V_{CC}$. In other words, the power source voltage $V_{CC}$ is supplied to the circuit in a vertical path in cross sectional view of FIGS. 5A. For this reason, it is possible to make the interconnection for supplying the power source voltage $V_{CC}$ extremely short. In addition, because the probability of a signal interconnection intersecting a power source interconnection is considerably reduced, it is possible to shorten the length of the signal interconnection owing to the fact that there is less need to make a roundabout route to avoid intersecting the power source interconnection. As a result, it is possible to realize a high-speed circuit operation.

By biasing the p-n junction between the n+-type substrate 61 and the p−-type layer 63 by the source voltage $V_{EE}$ which is the most negative voltage used in the integrated circuit, the p-n junction is always biased in the reverse direction and the penetration of current to various active devices constructed on the chip directly from the substrate 61 is positively prevented. In biasing the p-n junction, it should be noted that no substantial current is required to flow through the conductor pattern connecting the terminal 106 to the electrode 74 on the surface of the chip 60 (FIG. 5), and thereby such a conductor pattern can be provided by using an extremely thin conductor stripe. In other words, the provision of the conductor pattern for biasing the p-n junction does not introduce complexity of wiring on the surface of the chip.

As a result of the construction as such, the voltage supplied to the surface of the chip 60 via the metallized layer 62 and the conductive region 73 is no longer limited to $V_{EE}$ as in the case of the prior art of FIG. 3 but the source voltage $V_{CC}$ or any other voltage greater than the source voltage $V_{EE}$ may be employed. Thereby, an increased freedom of design of the integrated circuit becomes possible.

The resistivity of the conductive path in the semiconductor chip 60 from the metallized layer 62 to the interconnection conductor 79 through the n+-type substrate 61 and the n+-type conductive region 73 can be appropriately selected by changing the cross sectional area and/or the density of the n-type impurity of the conductive path and/or the thickness of the n-type layer 73.

For example, when the cross sectional area s of the conductive path is 100, $\mu m^2$, the length L of the conductive path is 5 microns and the resistivity $\rho$ of the conductor path in 0.01 $\Omega$cm, a resistance R of the conductive path becomes $R = \rho(L/s) = 5\Omega$. In this case, the voltage drop due to a current of 1 mA is 5 mV. In addition, when the n+-type substrate 61 has a size of 5 mm by 5 mm and a thickness t of 0.5 mm and a resistivity of 0.01 $\Omega$cm, a voltage drop V for the case where a current I of 1A flows in total may be described by $V = RI = \rho(t/s)I$. Hence, this voltage drop V is approximately 2 mV. Therefore, the total voltage drop is approximately 7 mV which is considerably small compared to the conventional case where the total voltage drop would be 50 mV or more.

The connection of the semiconductor chip 60 to the package 101 is made by die-bonding the semiconductor chip 60 on the stage 100. Thus, the power source voltage $V_{CC}$ can be stably supplied to the semiconductor chip 60 without wire-bonding.

The problem of electromigration will not occur because the length of the metal interconnection 79 for the power source voltage $V_{CC}$ can be made short and the current density can be held small.

It is possible to realize a large scale integrated (LSI) circuit having a higher density because the number of power source interconnections extending horizontally are reduced. Furthermore, the reliability of the semiconductor integrated circuit is improved because of the reduced number of levels of interconnections.

Since the n+-type substrate 61 has the high impurity density, it is possible to prevent the n-type substrate from being transformed into the p-type due to oxygen and carbon which are included in the silicon substrate when the substrate is sliced from an ingot grown by the Czochralski method.

Figure 7:
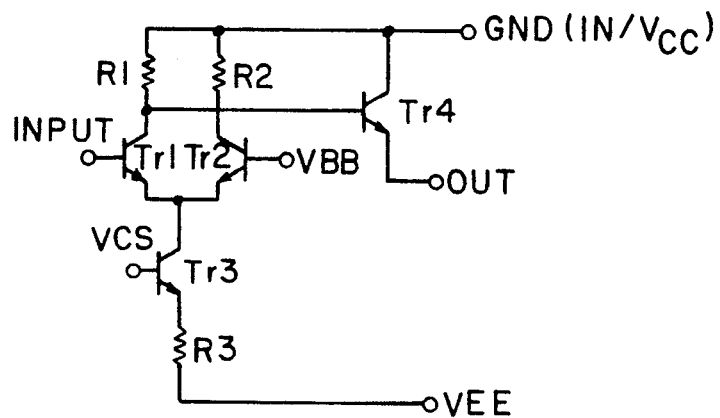
FIG. 7 is a circuit diagram showing an ECL circuit within the semiconductor chip shown in FIGS. 6A and 6B.

FIG. 7 is a circuit diagram of an ECL circuit within the semiconductor chip 60. In FIG. 7, transistors Tr1, Tr2, Tr3, Tr4 and resistors R1, R2 and R3 are connected as shown. $V_{EE}$ denotes the most negative power source voltage, $V_{BB}$ and $V_{CS}$ denote reference voltages, GND (IN/$V_{CC}$) denotes the ground voltage (and the alternative power source designations "In" and "$V_{CC}$" as employed in the prior FIGURES herein) INPUT denotes a signal input of the ECL circuit, and OUT denotes a signal output of the ECL circuit.

Figure 8:
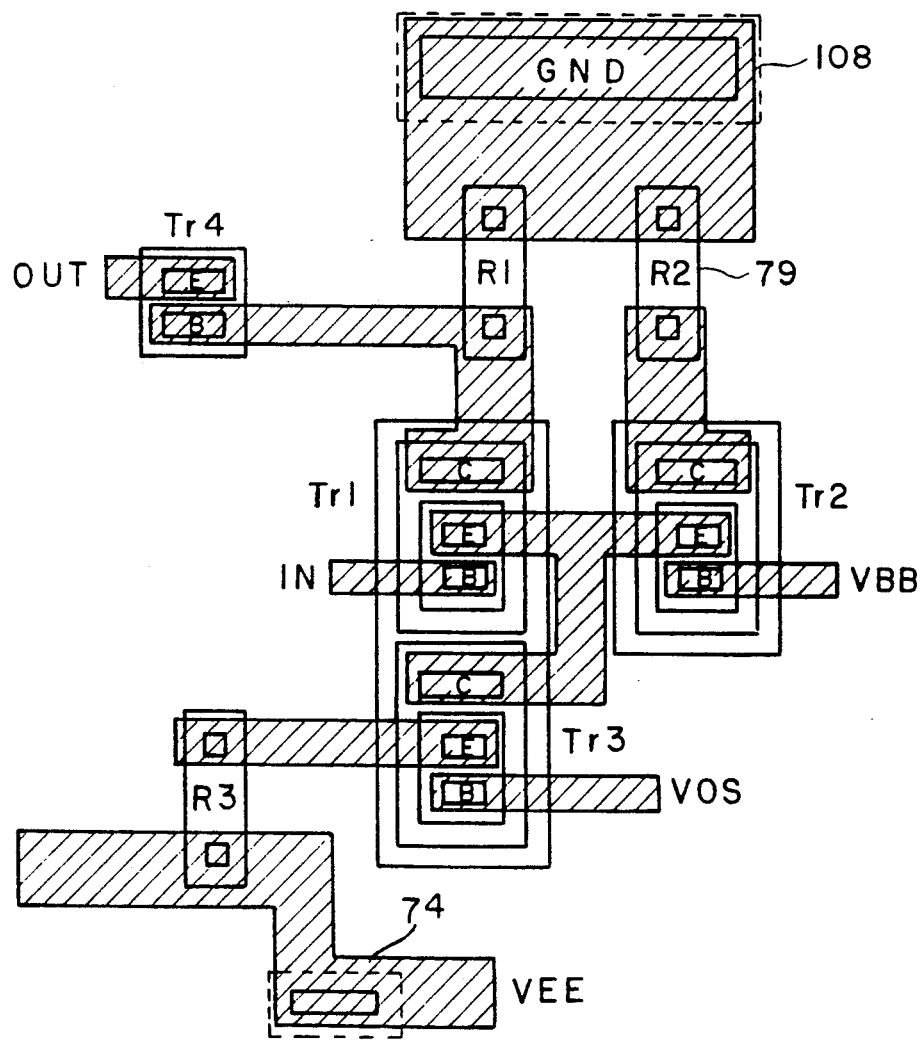
FIG. 8 is a plan view, on an enlarged scale showing interconnections for implementing the ECL circuit shown in FIG. 7.

FIG. 8 shows, in an enlarged scale, a plan view of the interconnections for realizing the ECL circuit shown in FIG. 7 using the first embodiment of the semiconductor integrated circuit shown in FIG. 5. In FIG. 8, those parts which are the same as those corresponding parts in FIGS. 5, 6A, 6B and 7 are designated by the same reference numerals, and description thereof will be omitted. In FIG. 8, the interconnections are shown with hatchings. B, E and C respectively denote the base, emitter and collector of the corresponding transistors Tr1 through Tr4.

Next, the process of fabricating the integrated circuit of FIG. 5 will be described with reference to FIGS. 9A–9E. In the drawings, these parts already described with reference to preceding drawings are given identical reference numerals and the description thereof will be omitted.

In a step of FIG. 9A, a part of the p−-type layer 63 on the n+-type substrate 61 is selectively subjected to ion implantation and a part of the buried layer 66 as well as a part of the n+-conductive layer 67 are formed. In a step of FIG. 9B, the n−-type layer 64 is grown on the layer 63 and thereby, the dopants in the already existing part of the layer 66 and the layer 67 are diffused into the layer 64. As a result, the buried layer 66 and the conductive region 67 are formed.

In a step of FIG. 9C, a U-groove 71 is formed on the surface of the chip so as to extend through the layers 64 and 63 down to the substrate 61, and the structure is subjected to a thermal oxidation process. In response to the thermal oxidation, the oxide layer 72 is formed on the side wall of the U-groove 71 including the free, upper or main surface. Further, the structure thus obtained is subjected to an etching process wherein a part of the oxide layer 72 at the bottom of the U-groove 71 as well as the part covering the free, upper or main surface of the structure are removed. With this, a structure shown in FIG. 9D is obtained.

Next, in a step of FIG. 9E, the U-groove 71 is filled by a doped polysilicon 73 doped to the n+-type which may be deposited by a CVD process. After removing superfluous polysilicon (not shown) on the surface of the structure of FIG. 9E, the structure of FIG. 9E is obtained.

Further, additional U-grooves U1 and U2 are formed on the surface of the structure of FIG. 9E to form a structure shown in FIG. 9F, and the grooves U1 and U2 are filled with polysilicon (IS1 and IS2, respectively) as shown in FIG. 9G. Next, the region 65 is formed by ion implantation followed by heat treatment and the structure shown in FIG. 9H is obtained. On this structure, the field oxide layer 70 is provided as usual, and the npn-transistor Tr of FIG. 5 is formed according to the well established process.

Figure 10:
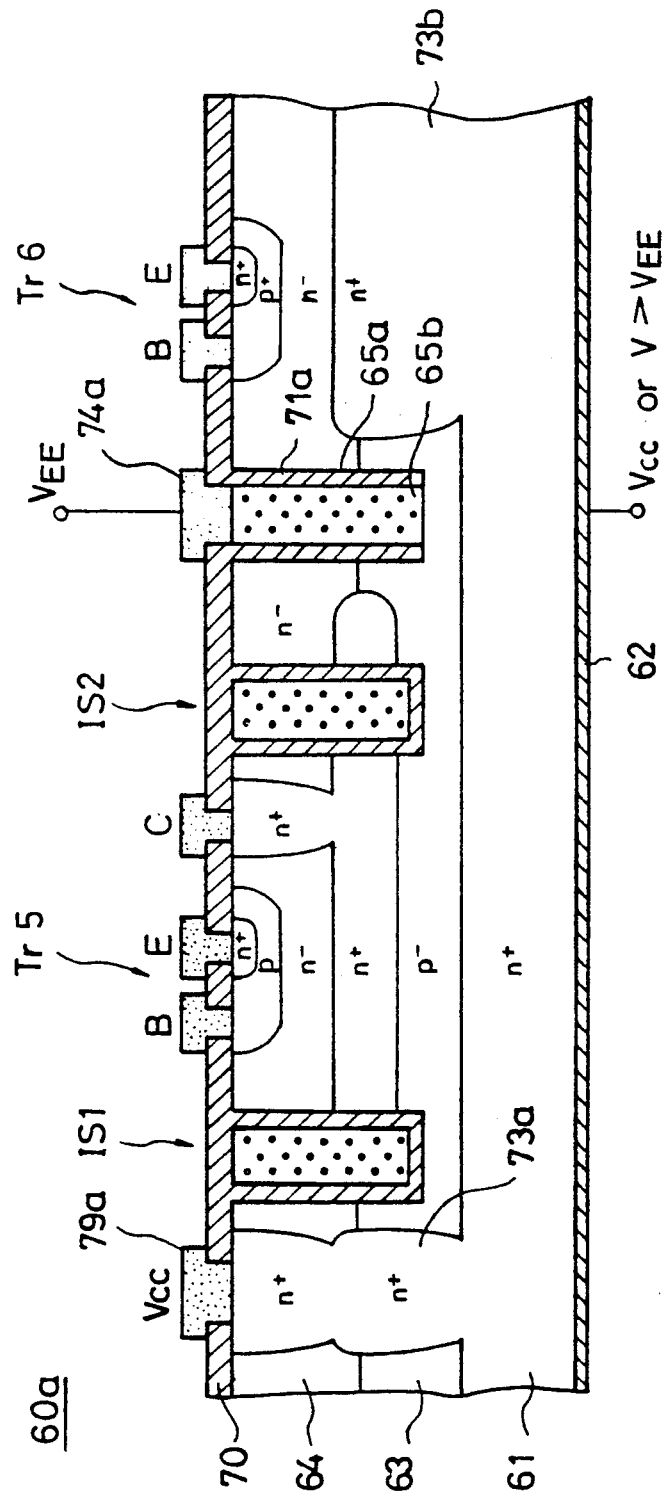
FIG. 10 is a cross-sectional view showing a second embodiment of the integrated circuit of the present invention.

FIG. 10 shows a second embodiment of the semiconductor integrated circuit according to the present invention. In FIG. 10, the parts identical to those corresponding parts described previously with reference to preceding drawings are given identical reference numerals and the description thereof will be omitted.

In the structure of FIG. 10 showing a chip 60a, an n+-type conductive region 73a is provided in place of the conductive region 73. This region 73a is formed by ion implantation and annealing steps which are repeated each time the layers 63 and 64 are grown as will be described. As the region 73a is formed by ion implantation, the conductive region 73a is not surrounded by the insulating side wall 72 (i.e., as in FIGS. 9A–9H), and the voltage, such as $V_{CC}$, at the bottom of the chip 60a is passed to an electrode 79a at the top of the chip 60a.

In this embodiment, in place of the p+-type conductive region 65 (of FIG. 9H), a U-groove 65a extending from the surface of the layer 64 to the layer 63 is formed. An oxide layer 71a is formed on the side wall of this groove 65a, and the groove is filled by a p+-type polysilicon 65b. On the exposed top surface of the polysilicon region 65b, an electrode 74a corresponding to the electrode 74 of FIG. 5 is provided and through this electrode 74, the source voltage $V_{EE}$ is applied. In response to the source voltage $V_{EE}$, the p-n junction at the boundary between the substrate 61 and the p−-type epitaxial layer 63 is biased reversely and penetration of the current to the region under the transistor Tr5 is prevented.

In this construction, there is another npn transistor Tr6, of which the collector is connected to an n+-type region 73b provided as a continuation of the n+-type substrate 61. Thus, the source voltage $V_{CC}$ is supplied directly to the collector of the transistor Tr6 through the conductive region 73b.

Next, the process of fabricating the integrated circuit of FIG. 10 will be described with reference to FIGS. 11A—11E. In these drawings, those parts identical to the parts already described with reference to preceding drawings are given identical reference numerals and the description thereof will be omitted.

In a first step of FIG. 11A, a layered structure comprising the substrate 61, the p−-type epitaxial layer 63, the n−-type epitaxial layer 64, the n+-type conductive regions 73a and 73b, and the buried layer 66 are formed. Next, U-grooves 65a, U1 and U2 are formed such that each of the grooves extends from the upper, main surface of the structure to the layer 63. The grooves U1 and U2 are formed at the respective, opposite lateral ends of the buried layer 66 and all of the grooves have side walls covered by an oxide insulator layer.

In the step of FIG. 11C, the insulator layer at the bottom of the groove 65a is removed, and in the step of FIG. 11D, polysilicon doped to the p+-type is deposited such that the grooves 65a, U1 and U2 are filled by the polysilicon. Thereby, the conductive region 65b is formed.

Further, ion implantation is performed on the epitaxial layer 64 in correspondence to the conductive region 73a and after annealing, another diffusion region 73c of the n+-type is formed as a continuation of the region 73a. Further, various devices such as the npn-transistors Tr5, Tr6 and the like are provided on the surface of the epitaxial layer 64 by well known process.

Further, the present invention is not limited to these embodiments described heretofore but various variations and modifications may be made without departing from the scope of the present invention.

What is claimed is:

1. A method of fabricating a semiconductor integrated circuit comprising a layered semiconductor body including a path for supplying an electric current from a rear side of the layered semiconductor body to an active device on a front side of the layered semiconductor body through the layered semiconductor body, comprising steps of:
   providing a substrate of a first conductivity type;
   providing a first layer of a second conductivity type on the substrate, the second conductivity type being opposite to the first conductivity type so that there is formed a p-n junction between the substrate and the first layer;
   providing a second layer of the first conductivity type on the first layer and providing an active device on a top surface of the second layer;
   providing a groove such that the groove extends from the top surface of the second layer to the substrate through the first layer;
   filling the groove with a semiconductor material having the first conductivity type, so that a path of electric current is established from the substrate to the top surface of the second layer;
   providing a first contact structure on the top surface of the second layer in correspondence to the semiconductor material filling the groove, as an output terminal for outputting an electric current that has been supplied to the substrate and directed via the path of electric current;
   providing a region of the second conductivity type in a part of the second layer different from the part where the groove is formed, such that the region reaches the first layer; and
   providing a second contact structure on the top surface of the second layer in correspondence to the region of the second conductivity type, for applying a bias voltage to the first layer.

2. A method as claimed in claim 1, further comprising a step of providing an insulator layer on a side wall of the groove prior to the step of filling the groove with the semiconductor material.

3. A method of fabricating a semiconductor integrated circuit comprising a layered semiconductor body including a path for supplying an electric current from a rear side of the layered semiconductor body to an active device on a front side of the layered semiconductor body through the layered semiconductor body, comprising steps of:
   providing a substrate of a first conductivity type;
   providing a first layer of a second conductivity type on the substrate, the second conductivity type being opposite to the first conductivity type so that there is formed a p-n junction between the substrate and the first layer;
   forming a first region of the first conductivity type in the first layer;
   providing a second layer of the first conductivity type on the first layer including the first region and providing an active device on a top surface of the second layer;
   providing a groove on the second layer such that the groove extends from the top surface of the second layer to the first layer;
   filling the groove by a semiconductor material of the second conductivity type;
   providing a first contact structure on the top surface of the second layer in correspondence to the groove filled by the semiconductor material, for applying a bias voltage to the first layer;
   forming a second region of the first semiconductor type in the second layer in correspondence to the first region with an impurity density higher than that of the second layer such that the first region and the second region are connected; and
   providing a second contact structure on the top surface of the second layer in correspondence to the second region, as an output terminal for outputting an electric current supplied to the substrate and passed through the first and second regions.

4. A method as claimed in claim 3 further comprising a step of providing an insulator layer on a side wall of the groove prior to the step of filling the groove.

* * * * *

UNITED STATES PATENT AND TRADEMARK OFFICE
CERTIFICATE OF CORRECTION

PATENT NO. : 5,240,867

DATED : AUGUST 31, 1993

INVENTOR(S) : KOUICH SUZUKI ET AL.

It is certified that error appears in the above-indentified patent and that said Letters Patent is hereby corrected as shown below:

On the title page, item [56]: References Cited, line 8, "4,845,475" should be --4,857,478--.
On the title page, Col. 2, line 4, "Wo86/00755," should be --WO86/00755--
line 11, "EC1" should be --ECL--.

Col. 3, line 44, "232" should be --23a--.

Col. 4, line 36, "member" should be --number--.

Col. 5, line 26, "and the" should be on --and on the--;
line 56, "region" should be --regions--.

Col. 6, line 27, "case the" should be --case of the--;
line 44, "area" should be --areas--.

Col. 7, line 5, "matallized" should be --metallized--;
line 9, "terminal" should be --terminals--.

Col. 8, line 1, "65" should be --74--;
line 2, "74" should be --65--;
line 18, "65" should be --74--;
line 18, "74" should be --65--;
line 47, "FIGS. 5A" should be --FIG. 5--.

UNITED STATES PATENT AND TRADEMARK OFFICE
CERTIFICATE OF CORRECTION

PATENT NO. : 5,240,867

DATED : AUGUST 31, 1993

INVENTOR(S) : KOUICH SUZUKI ET AL

It is certified that error appears in the above-indentified patent and that said Letters Patent is hereby corrected as shown below:

Col. 10, line 11, "these" should be --the--.

Col. 12, line 65, "3" should be --3,--.

Signed and Sealed this

Tenth Day of May, 1994

Attest:

BRUCE LEHMAN

Attesting Officer

Commissioner of Patents and Trademarks